(12) United States Patent
Yamaguchi et al.

(10) Patent No.: US 6,329,238 B1
(45) Date of Patent: Dec. 11, 2001

(54) METHOD OF FABRICATING A MEMORY DEVICE HAVING A LONG DATA RETENTION TIME WITH THE INCREASE IN LEAKAGE CURRENT SUPPRESSED

(75) Inventors: Ken Yamaguchi, Fuchu; Shinichiro Kimura, Kunitachi; Masatada Horiuchi, Koganei; Tatsuya Teshima, Sagamihara, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/716,244

(22) Filed: Nov. 21, 2000

Related U.S. Application Data

(62) Division of application No. 09/185,633, filed on Nov. 4, 1998, now Pat. No. 6,157,055.

(30) Foreign Application Priority Data

Nov. 4, 1997 (JP) .................................................... 9-301559

(51) Int. Cl.⁷ ................................................. H01L 21/8242
(52) U.S. Cl. ........................ 438/244; 438/254; 438/256; 438/397
(58) Field of Search ................................. 438/239, 240, 438/244, 254, 256, 397, 396; 257/301, 306, 303, 309, 311, 308, 316, 296

(56) References Cited

U.S. PATENT DOCUMENTS

| | | | |
|---|---|---|---|
| 5,343,356 | * 8/1994 | Lee et al. | 361/322 |
| 5,362,663 | 11/1994 | Bronner et al. | 437/52 |
| 5,521,115 | 5/1996 | Park et al. | 437/60 |
| 6,066,881 | 4/2000 | Shimizu et al. | 257/392 |
| 6,258,660 | * 7/2001 | Walker et al. | 438/244 |

FOREIGN PATENT DOCUMENTS 53108392 9/1978 (JP) ....................................................

* cited by examiner

Primary Examiner—Wael Fahmy, Jr.
Assistant Examiner—Fernando Toledo
(74) Attorney, Agent, or Firm—Antonelli, Terry, Stout & Kraus, LLP

(57) ABSTRACT

In a semiconductor memory device such as a DRAM, a conductive film is arranged on the rim portion of a isolation insulating film in opposition to a semiconductor substrate with a thin insulating film in between. This conductive film is electrically connected to a lower electrode of a storage capacitor. This novel arrangement can control the location of electrical pn junction independently of the location of metallurgical pn junction, thereby realizing a semiconductor memory device having a long data retention time with the increase in leakage current suppressed.

4 Claims, 8 Drawing Sheets

METHOD OF FABRICATING A MEMORY DEVICE HAVING A LONG DATA RETENTION TIME WITH THE INCREASE IN LEAKAGE CURRENT SUPPRESSED

CROSS-REFERENCE TO RELATED APPLICATION

This application is a divisional of application Ser. No. 09/185,633, filed on Nov. 4, 1998, now U.S. Pat. No. 6,157,055 the entire disclosure of which is hereby incorporated by reference.

BACKGROUND OF THE INVENTION

1. Field of the Invention

The present invention generally relates to a semiconductor memory device and a method of fabricating the same and, more particularly, to a semiconductor memory device that is microscopic in size and long in storage retention time and especially suitable for a dynamic random access memory (hereafter referred to as DRAM) and a method of fabricating such a semiconductor memory device.

2. Description of the Prior Art

The DRAM has been increasing in integration density at a rate as high as four times every three years. Currently, DRAMs of which integration densities are 16 megabits and 64 megabits are mass-produced and mass-production of gigabit-order DRAMs is being planned. Such high integration has been achieved miniaturizing the planar and depth dimensions of the DRAM. However, the miniaturization lowers the signal-to-noise ratio because of the reduction in the amount of charge that can be built up and makes conspicuous troubles such as signal reversal due to the incidence of alpha ray, presenting a serious problem of reliability maintenance.

Consequently, a memory cell that can increase storage capacity has been strongly desired. For such a memory cell, Japanese Published Unexamined Patent Application No. Sho 53-108392 (Japanese Published Examined Patent Application No. Sho 61-55528) discloses a structure as shown in FIG. 15. The memory cell having the disclosed structure is called a stacked capacitor cell (STC) in which a part of a storage capacitor is stacked on a switch transistor or an isolation insulating transistor. This memory cell is expected to replace the conventional planar capacitor cell.

Referring to FIG. 15, reference numeral 2.1 denotes a semiconductor substrate, reference numeral 2.2 an isolation insulating film, reference numeral 2.3 a channel portion of a switching transistor, reference numerals 2.4 and 2.5 impurity diffused layers, reference numeral 2.6 a gate insulating film, reference numeral 2.7 a word line providing the gate electrode of switching transistor, reference numeral 2.9 a bit line, reference numerals 2.10 and 2.14 interlayer insulating films, reference numeral 2.11 a lower electrode of storage capacitor, reference numeral 2.12 a dielectric film of storage capacitor, reference numeral 2.13 a plate electrode (upper electrode) of storage capacitor, and reference numeral 2.15 a wiring metal. The bit line 2.9 is electrically connected to the impurity diffused layer 2.4 through an extended electrode 2.8. The lower electrode 2.11 is electrically connected to the impurity diffused layer 2.5.

With the conventional STC cell shown in FIG. 15, the lower electrode 2.11 of the storage capacitor can be extended over the word line 2.7, so that far greater storage capacitance can be realized than that of the planar capacitor cell that uses only the surface of semiconductor substrate as a storage capacitor.

The STC cell shown in FIG. 15 is fabricated through the following processes. First, a relatively thick (about 100 to 1000 nm) silicon oxide film for electrically separating elements is grown on the semiconductor substrate 2.1 made of single-crystal silicon by known thermal oxidation to form the isolation insulating film. The gate electrode of transistor 2.6 (about 5 to 50 nm) is grown by known thermal oxidation. Then, an impurity-doped polycrystalline silicon film is formed, which is worked into a predetermined shape by known photo-lithography and dry-etching to form the word line 2.7. Using the word line 2.7 as a mask, an impurity having a different conductive type from that of the semiconductor substrate 2.1 is introduced into the same by a known ion implantation technique. Then, predetermine thermal processing is performed to activate the above-mentioned doped impurity to form the impurity-diffused layers 2.4 and 2.5.

Next, a polycrystalline silicon film of the same conductive type is formed by known CVC (Chemical Vapor Deposition) such that the film comes in contact with the above-mentioned impurity-diffused layer 2.5. The unwanted portions of the film thus formed are removed by etching to form the lower electrode 2.11 of the storage capacitor. As is clear from FIG. 15, the above-mentioned lower electrode 2.11 is formed also extending over the word line 2.7 and the isolation insulating film 2.2, so that the area of the lower electrode 2.11 of the storage capacitor becomes extremely large, resulting in an increased amount of charge to be stored.

SUMMARY OF THE INVENTION

However, the above-mentioned conventional STC cell involves the following problems that remain to be solved.

For the requirement to enhance both of device operation speed and packing density of memory cells, miniaturization of planar dimensions is performed, resulting in about 0.1 to 0.2 microns of the width of the word line 2.7 in a memory device of 10-megabit order.

However, if the planar dimensions are miniaturized in the above-mentioned structure in order to realize the high device operation speed, a so-called punch-through phenomenon is caused, making it difficult to obtain good device characteristics. To overcome this problem, it is conventionally generally practiced to make the junction depth as shallow as possible. The typical junction depth is about 0.1 micron. In order to realize such a shallow junction depth, the thermal processing for impurity activation to be performed after the ion implantation into the semiconductor substrate 2.1 is performed at a relatively low temperature and a relatively short time.

However, the execution of such a low-temperature and short-time thermal processing causes a new problem of causing an electrical defect or a so-called deep trap in the impurity implantation into the semiconductor substrate 2.1. This problem increases the leakage current at the pn junction between the semiconductors of different conductive types, making it difficult to hold a predetermined storage retention time. Consequently, if the area of the storage capacitor is increased by the STC cell, the increase in the leakage current from the impurity diffused layer 2.5 electrically connected to the lower electrode 2.11 prompts the discharge of the storage charge, thereby making it difficult to form a shallow junction to pose limitations on the miniaturization of device structures.

It is therefore an object of the present invention to provide a miniaturized semiconductor memory device that is extremely small in leakage current and sufficiently long in storage retention time and a method of fabricating such a semiconductor memory device with ease.

In carrying out the invention and according to one aspect thereof, there is provided a semiconductor memory device comprising: a plurality of active regions formed on a semiconductor substrate; a metal oxide semiconductor transistor formed on the plurality of active regions; a separation insulating film formed between adjacent ones of the plurality of active regions for electrically separating the same from each other; a lower electrode of a storage capacitor, the lower electrode being electrically connected to one of a pair of diffused layers of the metal oxide semiconductor transistor formed in a surface region of the plurality of active regions and having a conductor type reverse to that of the semiconductor substrate, the lower electrode extending over the active region and the separation insulating film; a dielectric film and an upper electrode of the storage capacitor, the dielectric film and the upper electrode being stacked on the lower electrode; and a conductive film arranged in a rim portion in the separation insulating film in a manner opposed to the semiconductor substrate with an insulating film in between; wherein the lower end portion of the lower electrode is electrically connected to the upper end portion of the conductive film.

The above-mentioned deep traps for increasing the lead current are induced by the impurity introduction from the surface of the semiconductor substrate and the low-temperature and short-time thermal process for obtaining the miniaturized structure. These deep traps, if it occurs in a depletion layer, cause a large leakage current. Therefore, if the deep traps occur outside the depletion layer, no increase in the leakage current is caused.

FIGS. 2(a) and 2(b) are diagrams for describing the principles of the present invention. FIG. 2(a) is an enlarged view of a portion indicated by a dash line I in FIG. 15. With reference to FIG. 2(a), components similar to those previously described with FIG. 15 are denoted by the same reference numerals. The examination done by the inventor thereof et al. indicates that the increase in the leakage current is caused if (1) the above-mentioned deep traps occur concentrically especially in area A in the proximity of the interface between the isolation insulating film 2.2 and the impurity diffused layer 2.5 and (2) part of this area A overlaps a depletion layer B formed around a metallurgical pn junction C.

In the semiconductor memory device according to the invention, a conductive film 1.11' is buried in the end of the isolation insulating film 1.2 to be electrically connected to the lower electrode 1.11 of the storage capacitor as shown in FIG. 1. The conductive film 1.11' operates as the bottom of the lower electrode 1.11 of the storage capacitor and has a same structure in which part of the lower electrode 1.11 is buried in the isolation insulating film 1.2.

FIG. 2(b) is an enlarged view of the portion indicated by a dash line II in FIG. 1. With reference to FIG. 2(b), components similar to those previously described with FIG. 1 are denoted by the same reference numerals. The above-mentioned buried conductive film 1.11' is opposed to the semiconductor substrate 1.1 with the thin insulating film 1.2 in between, so that the buried conductive film 1.11' operates as a gate electrode, forming an inversion layer in the interface between the above-mentioned thin insulating film 1.2 and the semiconductor substrate 1.1. The formation of this inversion layer in turn forms a depletion layer B' below the depletion layer B shown in FIG. 2(a) in the proximity of the interface between the thin insulating film 1.2 and the semiconductor substrate 1.1. Namely, the location of the depletion layer B' to be actually formed can be controlled independently of the location of the depletion layer B spreading around the metallurgical pn junction C. Consequently, executing control such that the deep traps occurring in the above-mentioned area A concentrically are prevented from getting in the depletion layer B' by means of a voltage to be applied to the lower electrode 1.11 can effectively prevents the lead current from being caused by the deep trap.

FIG. 14 shows a diagram illustrating a result of confirming the effects of the present invention by means of computer simulation. Curve A indicates the reverse bias current/voltage characteristic of the pn junction according to the invention. Curve B indicates the reverse current/voltage characteristic of the pn junction according to the conventional structure. As seen from curve B, the conventional structure quickly increases the reverse leakage current over a certain voltage value. Namely, curve B indicates that, despite the stored charge amount by means of the employment of the STC cell structure, the increased reverse bias leakage current discharges the storage capacitor in a short time. On the contrary, as shown by curve A, the structure according to the invention is always suppressed to a low value, thereby extending the discharge duration by more than one order of magnitude as compared with the conventional structure.

To control the location of the depletion layer by the buried conductive film 1.11', it is desired for the thickness of the above-mentioned thin insulating film to be within a predetermined range. Use of a silicon oxide film having a thickness of from 3 to 50 nm provides a practically preferable result.

Also, it is desired for the above-mentioned isolation insulating film to be formed in the groove formed in the above-mentioned semiconductor substrate between adjacent active regions. This facilitates the forming of the conductive film electrically connected to the above-mentioned lower electrode.

The above-mentioned STC cell can be formed by forming a bit line on one impurity diffused layer of the above-mentioned MOS transistor through an extended electrode and forming the lower electrode in an extended manner from over the other impurity diffused layer to over the interlayer insulating film formed on the above-mentioned bit line.

The lower electrode is formed at a predetermined portion thereof with a recess portion. Forming the above-mentioned dielectric film on the upper surface of the lower electrode and along the inner surfaces of the recess portion increases the electrode area of the capacitor, significantly increasing the amount of charge to be stored.

For the conductive film electrically connected to the lower electrode, a film of a material appropriately selected from a group consisting of polycrystalline silicon, tungsten silicide, and molybdenum silicide can be used.

The above-mentioned semiconductor memory device according to the invention can be fabricated with ease by a semiconductor memory device fabricating method comprising the steps of: forming a groove in a semiconductor substrate at a predetermined location; forming an insulating film all over a resultant surface of the semiconductor substrate; forming selectively a conductive film on a portion of the insulating film, the portion being formed on the inner side walls of the groove; forming a separation region by filling the groove with a second insulating film; forming a metal oxide semiconductor transistor on the surface of a desired region other than the separation region on the semiconductor substrate; forming a lower electrode of a storage capacitor, the lower electrode being electrically connected to one of a pair of diffused layers of the metal oxide semiconductor transistor having a conductor type reverse to that of the semiconductor substrate and to the conductive film, the lower electrode extending over the metal oxide semiconductor transistor and the separation region; and forming a dielectric film of the storage capacitor and an upper electrode of the storage capacitor on the lower electrode in a stacked manner.

Executing the step of forming the above-mentioned insulating film all over the top surface of the above-mentioned semiconductor substrate by thermally oxidizing the surfaces exposed on the semiconductor substrate provides a silicon oxide film having an excellent film quality. Executing the step of selectively forming the above-mentioned conductive film by anisotropic etching after forming the conductive film all over the top surface of the semiconductor substrate can selectively leave the conductive film only on the insulating films on the side surfaces of the groove.

For the above-mentioned conductive film, films of various materials are available; practically, however, a polycrystalline silicon film formed by chemical vapor deposition is most convenient.

The foregoing and other objects, advantages, manner of operation and novel features of the present invention will be understood from the following detailed description when read in connection with the accompanying drawings.

BRIEF DESCRIPTION OF THE DRAWINGS

These and other objects of the invention will be seen by reference to the description, taken in connection with the accompanying drawing, in which.

DETAILED DESCRIPTION OF PREFERRED EMBODIMENTS

This invention will be described in further detail by way of example with reference to the accompanying drawings.

Figure 1:
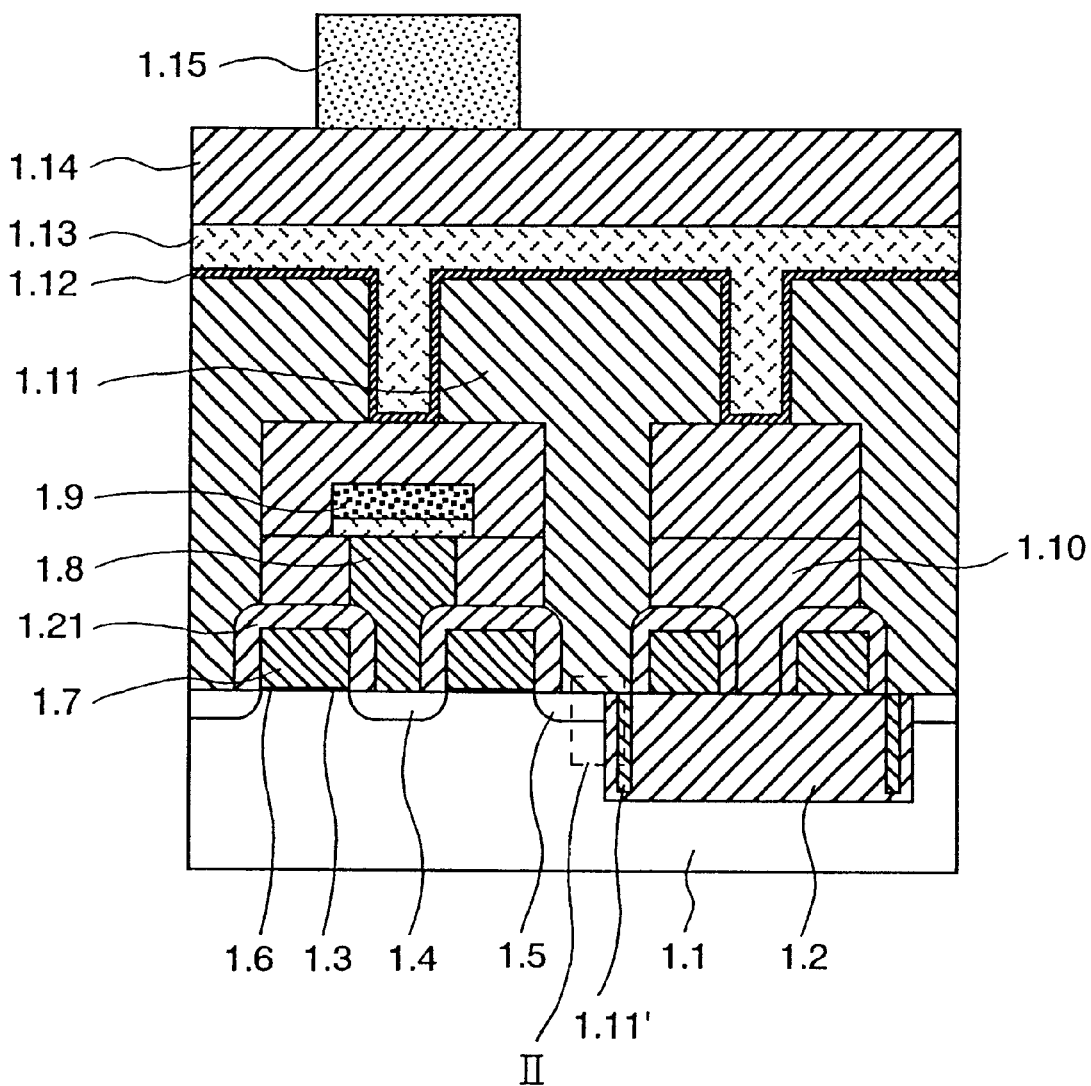
FIG. 1 is a cross section illustrating a memory cell practiced as one preferred embodiment of the invention.
Figure 2A:
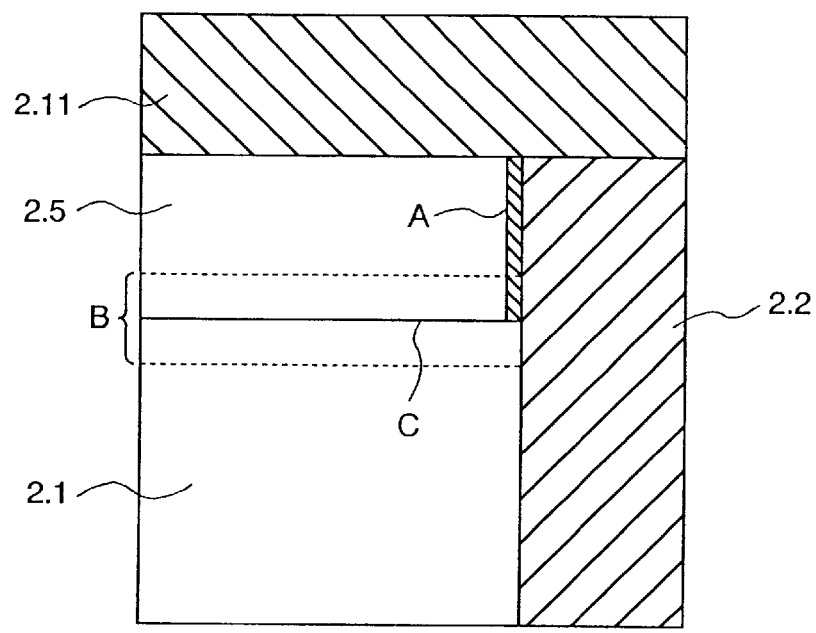
FIG. 2(*a*) and FIG. 2(*b*) are partial cross sections illustrating the principles of the invention.
Figure 2B:
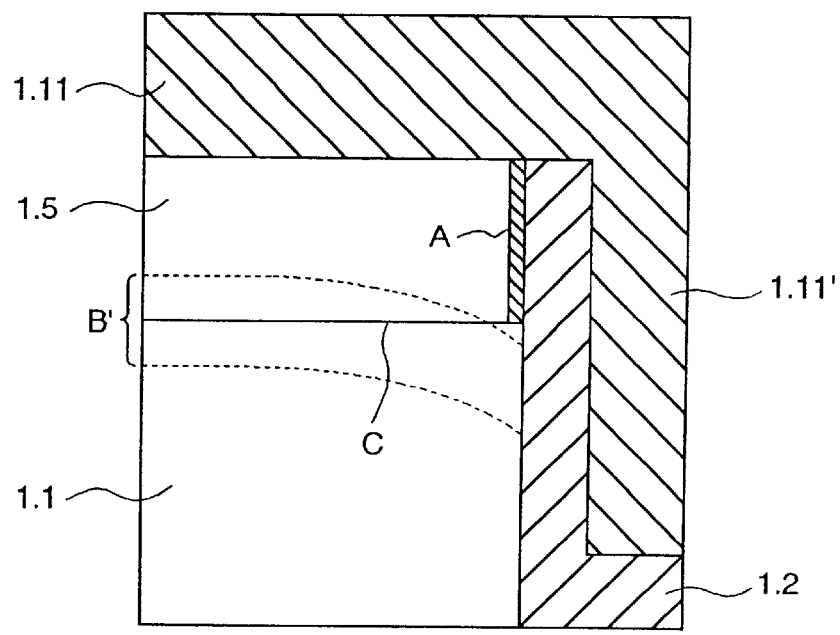

Now, referring to FIG. 1, there is shown a cross section of a memory practiced as one preferred embodiment of the invention. In the figure, reference numeral 1.1 denotes a semiconductor substrate, reference numeral 1.2 an interlayer isolation insulating film, reference numeral 1.3 a channel portion of a switching transistor, reference numerals 1.4 and 1.5 impurity diffused layers, reference numeral 1.6 a gate insulating film, reference numeral 1.7 a word line providing the gate electrode of the switching transistor, reference numeral 1.9 a bit line, reference numerals 1.10 and 1.14 interlayer insulating films, reference numeral 1.11 a lower electrode of storage capacitor, reference numeral 1.12 a dielectric film of storage capacitor, reference numeral 1.13 a plate electrode (upper electrode) of storage capacitor, and reference numeral 1.15 a wiring metal. The bit line 1.9 is electrically connected to the impurity diffused layer 1.4 through an extended electrode 1.8. The lower electrode 1.11 is electrically connected to the impurity diffused layer 1.5. The present invention is characterized by that a conductive film 1.11' electrically connected to the lower electrode 1.11 of the storage capacitor is buried at ends of the isolation insulating film 1.2 in an arrangement opposed to the semiconductor substrate 1.1 with the insulating film 1.2 in between. This constitution can place, outside a depletion layer; deep traps occurring concentrically in the proximity of the interface with the isolation insulating film 1.2 in the impurity diffused layer 1.5, thereby preventing a leakage current from occurring. Referring to FIG. 1, the conductive film 1.11' reaches in the proximity of the bottom of the isolation insulating film. Burying this film at least to the junction depth sufficiently attains the effect of leakage current prevention.

As shown in FIG. 1, the word line 1.7 can be arranged on the isolation insulating film 1.2. Each word line 1.7 is covered with a silicon nitride film 1.21 for protection and insulated from the extended electrode 1.8 and the lower electrode 1.11. The extended electrode 1.8 connected to the impurity diffused layer 1.4 of the MOS transistor is formed by polycrystalline silicon. The bit line 1.9 is formed by a stack of a polycrystalline silicon film and various silicide films such as tungsten silicide.

The lower electrode 1.11 of the storage capacitor is formed as follows. First, the bit line 1.9 is covered with the interlayer insulating film 1.10 composed of a silicon oxide film. The surface of the film is planarized. Known reactive ion etching is performed on the interlayer insulating film 1.10 to form an opening through which the tops of the impurity diffused layer 1.5 and the conductive film 1.11' are exposed. Then, a polycrystalline silicon film is formed to be patterned into a desired shape. Obviously, this polycrystalline silicon film is doped with an abundance of an n-type impurity, presenting an extremely low resistance.

The isolation insulating film 1.2 may be not only an buried oxide film but also a isolation insulating film formed by known LOCOS process. Practically, a structure in which grooves are buried with an insulating film can be formed with ease.

As described, the present invention controls the location of the depletion layer in a semiconductor substrate by use of the conductive film arranged in an isolation insulating film as opposed to the semiconductor substrate with a thin insulating film in between. Therefore, the present invention is not limited to the above-mentioned STC structure. The present invention is applicable to any semiconductor memory devices having the structure in which the conductive film arranged in opposition to the semiconductor substrate with a thin insulating film in between can be electrically connected to the lower electrode of a storage capacitor, regardless of the structure of the storage capacitor itself.

The following describes a method of fabricating the memory cell of the present invention with reference to FIGS. 3 through 13.

Figure 3:
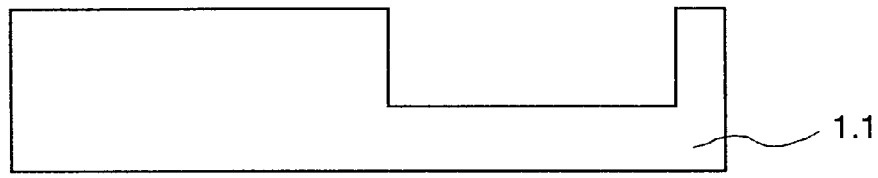
FIG. 3 is a process diagram for describing a method of fabricating the memory cell of FIG. 1.

First, as shown in FIG. 3, a groove is formed in the semiconductor substrate 1.1 at a predetermined location by use of known photolithography and reactive ion etching techniques.

Figure 4:
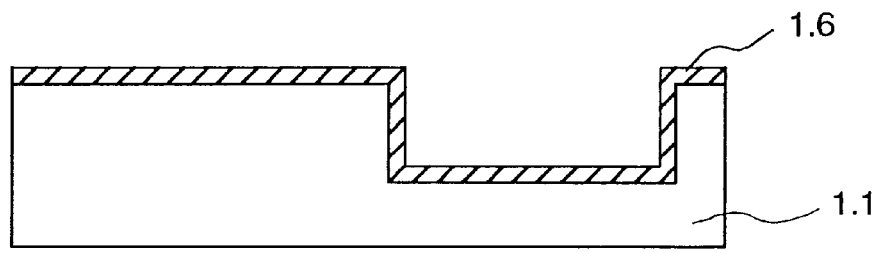
FIG. 4 is another process diagram for describing the method of fabricating the memory cell of FIG. 1.

Next, as shown in FIG. 4, the thin silicon oxide film 1.6 providing parts of the gate insulating film and the isolation insulating film is formed all over the top surface of the semiconductor substrate 1.1 by a known thermal oxidizing process.

Figure 5:
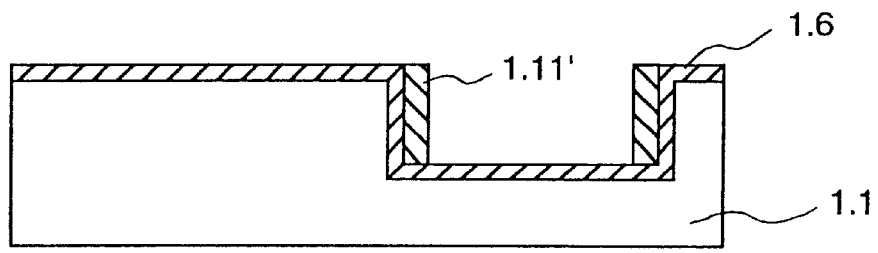
FIG. 5 is still another process diagram for describing the method of fabricating the memory cell of FIG. 1.

Then, after the low-resistance polycrystalline silicon film 1.11' is formed all over the silicon oxide film 1.6 by the use of a known CVD process, known dry etching is performed to leave the polycrystalline silicon film 1.11' only on the inner side walls of the groove, removing the polycrystalline silicon film 1.11' from the other portions on the silicon oxide film 1.6 as shown in FIG. 5.

Figure 6:
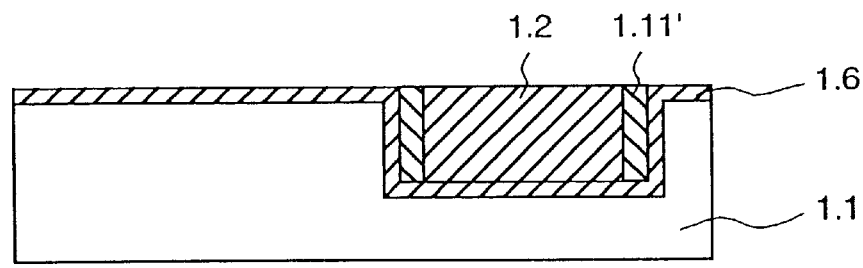
FIG. 6 is yet another process diagram for describing the method of fabricating the memory cell of FIG. 1.

The resultant groove is filled with the silicon oxide film 1.2 to form a structure shown in FIG. 6 by use of the known CVD and planarizing processes.

Figure 7:
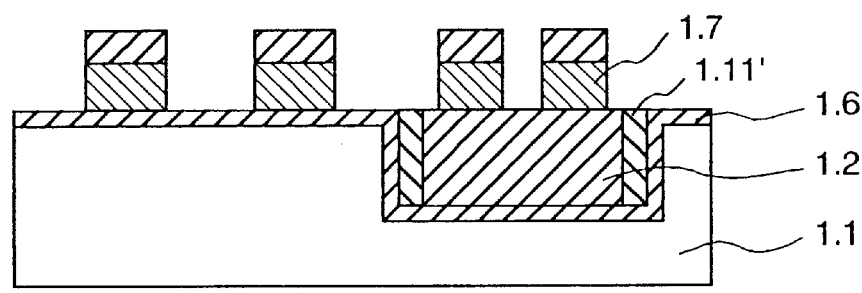
FIG. 7 is a different process diagram for describing the method of fabricating the memory cell of FIG. 1.

Next, by use of the known CVD process, the polycrystalline silicon film 1.7 and the silicon nitride film 1.21 are formed in stack. Known photoetchting is performed on the stack to remove unwanted portions to form the gate electrode 1.7 as shown in FIG. 7.

Figure 8:
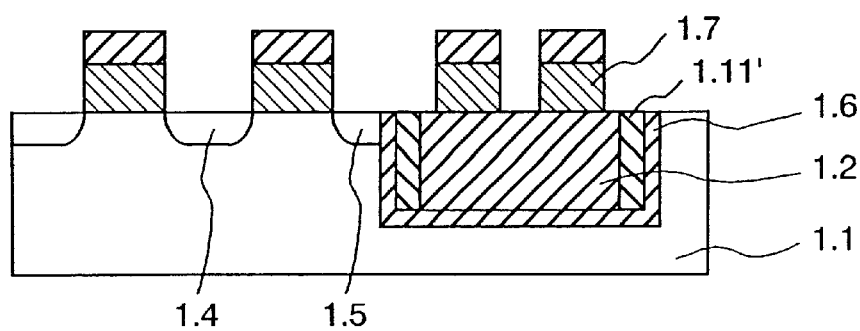
FIG. 8 is a still different process diagram for describing the method of fabricating the memory cell of FIG. 1.

Using the silicon nitride film 1.21 and the gate electrode 1.7 as a mask, high-density phosphorus is ion-implanted into the semiconductor substrate 1.1. A predetermined thermal process is further performed to form the impurity diffused layers 1.4 and 1.5 of MOSFET as shown in FIG. 8.

Figure 9:
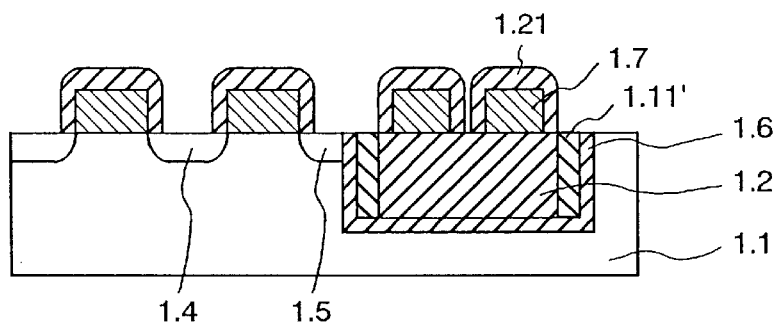
FIG. 9 is a yet different process diagram for describing the method of fabricating the memory cell of FIG. 1.
Figure 10:
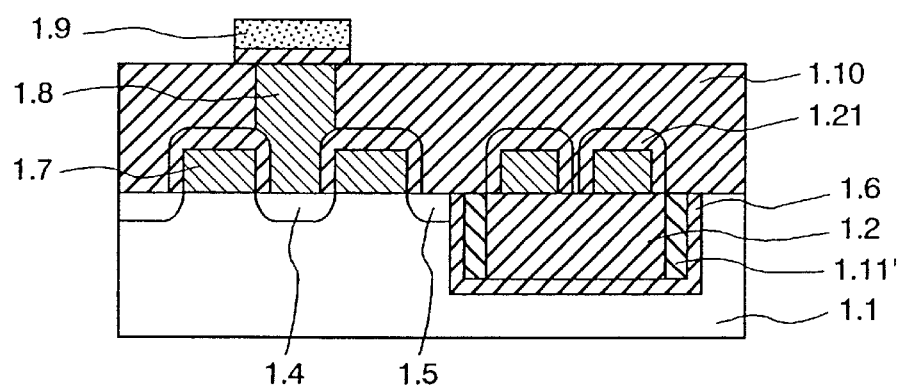
FIG. 10 is a separate process diagram for describing the method of fabricating the memory cell of FIG. 1.
Figure 11:
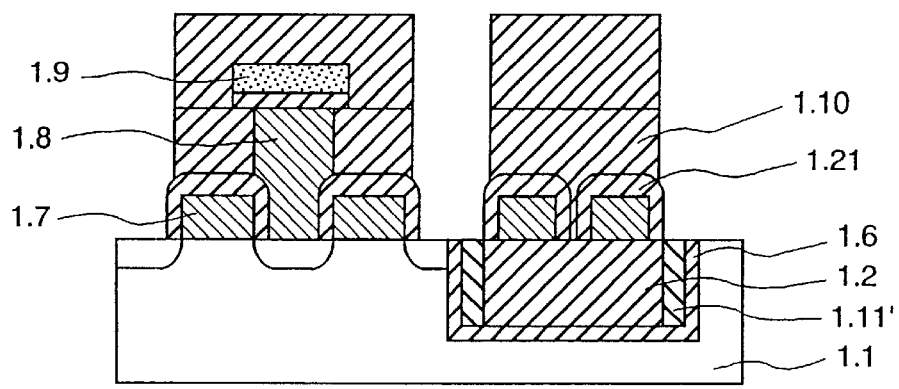
FIG. 11 is a still separate process diagram for describing the method of fabricating the memory cell of FIG. 1.

Then, as shown in FIG. 9, after forming the silicon nitride film 1.21 for protecting the gate electrode 1.7 by use of the known CVD process, the silicon oxide film is formed all over the resultant surfaces to a thickness of 500 nm by use of the known CVD process. Further, the formed silicon oxide film 1.10 is etched at a predetermined portion to remove the same. The etched portion is then filled with the polycrystalline silicon film 1.8. Next, a stacked film composed of a polycrystalline silicon film and a tungsten silicide film is formed by use of a known process, an unwanted portion thereof being removed to form the bit line 1.9 as-shown in FIG. 10.

The silicon oxide film 1.10 for protecting the bit line 1.9 is formed all over the resultant surfaces. A predetermined portion is removed by etching to expose the top surfaces of the impurity diffused layer 1.5 and the conductive film 1.11', forming a structure shown in FIG. 11.

Figure 12:
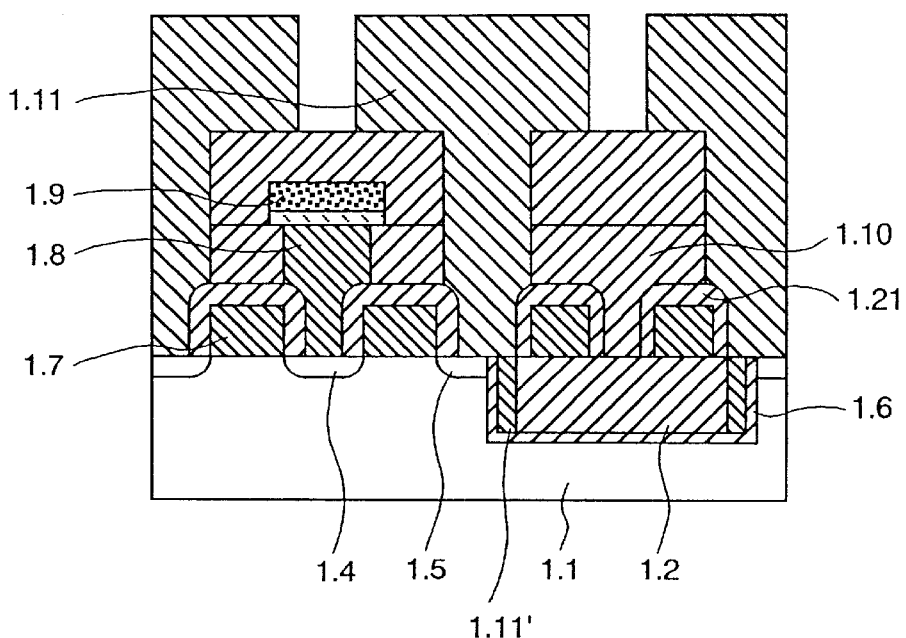
FIG. 12 is a yet separate process diagram for describing the method of fabricating the memory cell of FIG. 1.

Then, after a phosphorus-doped polycrystalline silicon film is formed all over the resultant surfaces to a thickness of 600 nm, a predetermined portion is removed by etching to form a groove, thereby increasing the surface area to form the lower electrode 1.11 of the storage capacitor as shown in FIG. 12.

Figure 13:
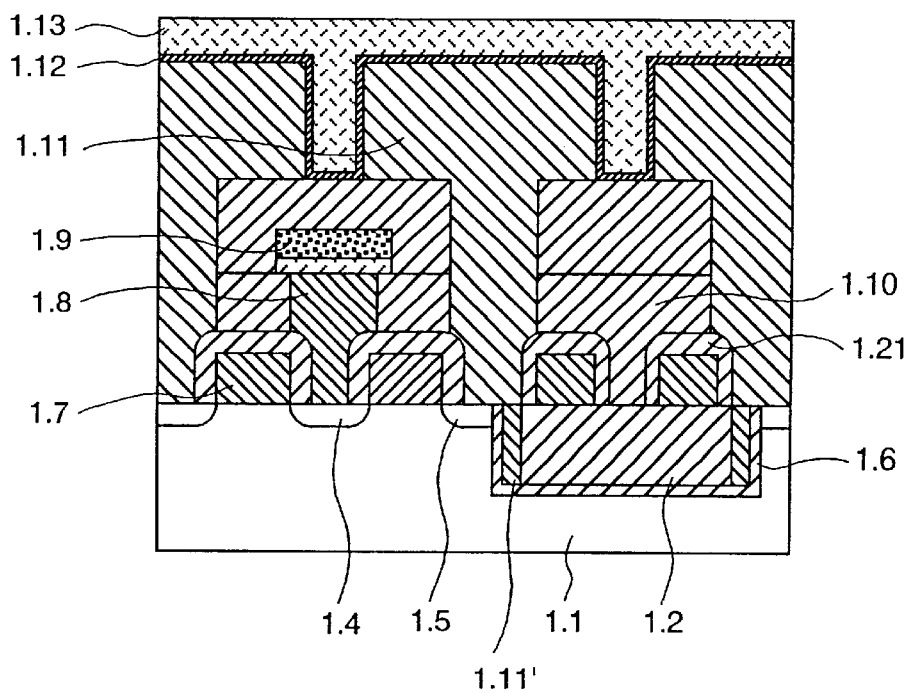
FIG. 13 is another process diagram for describing the method of fabricating the memory cell of FIG. 1.
Figure 14:
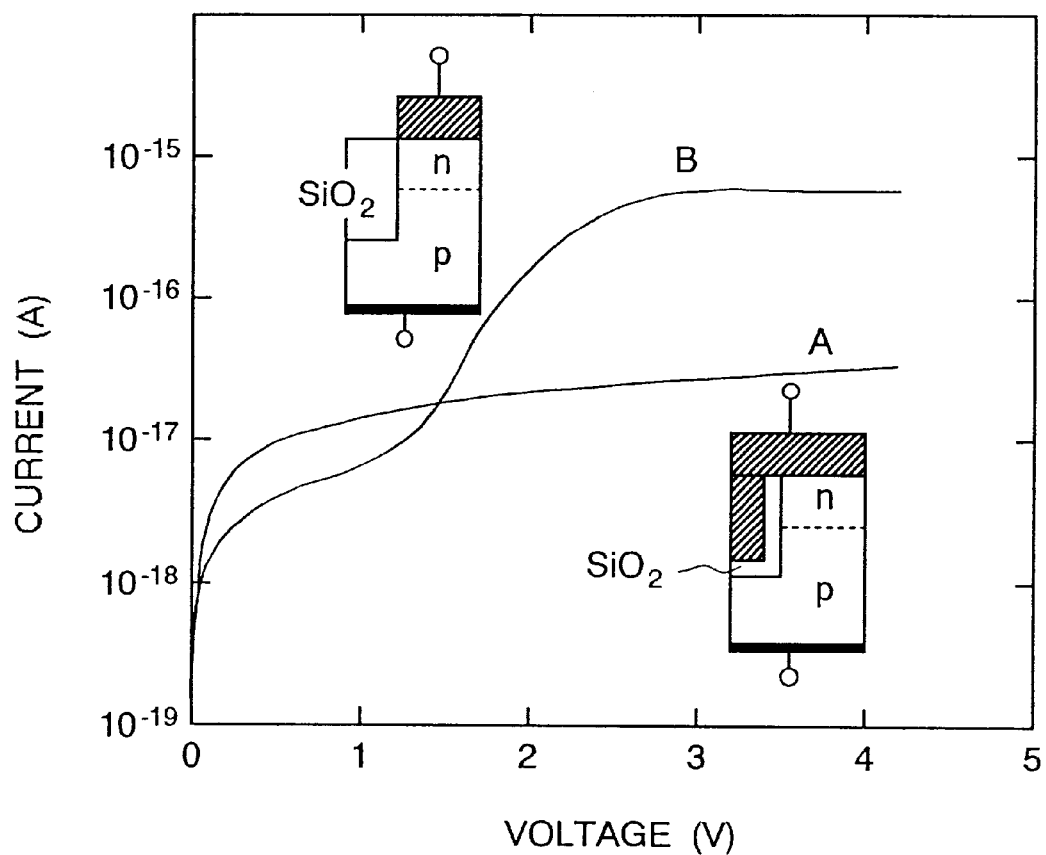
FIG. 14 is a diagram illustrating effects of the invention.
Figure 15:
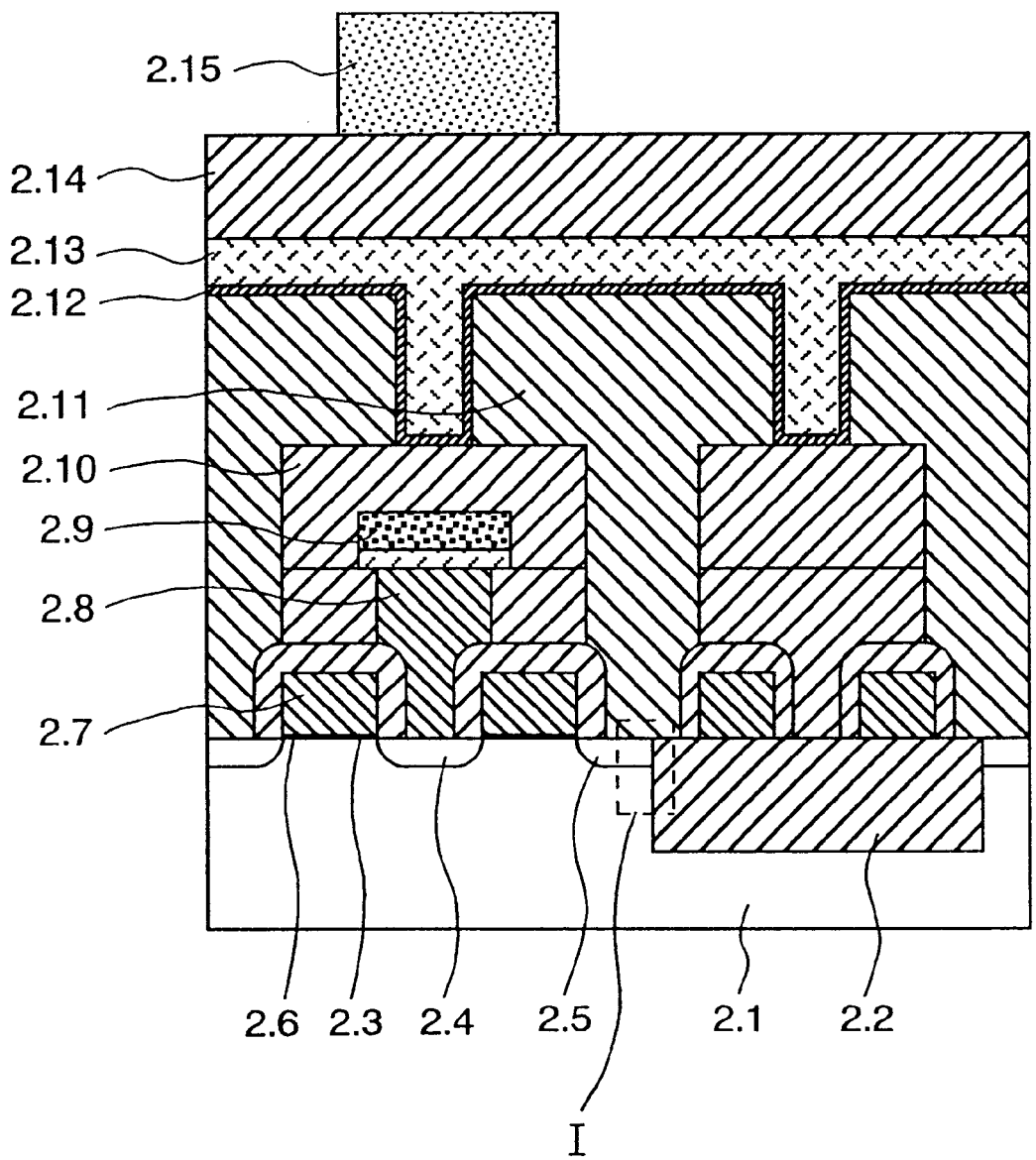
FIG. 15 is a cross section illustrating a prior-art memory cell.

Finally, as shown in FIG. 13, a tantalum oxide layer is formed to a thickness of 10 nm to form the dielectric film 1.12 of the storage capacitor, upon which a tungsten silicide film is formed to form the upper electrode 1.13 of the storage capacitor. In the present embodiment, the tantalum oxide film is used for the dielectric film 1.12. Alternatively, a silicon nitride film may be used.

The semiconductor memory device practiced as the preferred embodiment of the invention is small in the leakage current at each pn junction and therefore provides a good characteristic as a memory device having a sufficiently long data retention time.

As described and according to the invention, an electrical pn junction can be put to a location different from the location of a metallurgical pn junction, thereby preventing deep traps from getting in a depletion layer. The novel constitution has realized a low-leakage memory cell that secures a data retention time required by a DRAM of several tens of megabits to the order of gigabits.

As many apparently different embodiments of this invention may be made without departing from the spirit and scope thereof, it is to be understood that the invention is not limited to the specific embodiments thereof except as defined in the appended claims.

What is claimed is:

1. A semiconductor memory device fabricating method comprising the steps of:

forming a groove in a semiconductor substrate at a predetermined location;

forming an insulating film all over a resultant surface of said semiconductor substrate;

forming selectively a conductive film on a portion of said insulating film, said portion being formed on inner side walls of said groove;

forming a separation region by filling said groove with a second insulating film;

forming a metal oxide semiconductor transistor on the surface of a desired region other than said separation region on said semiconductor substrate;

forming a lower electrode of a storage capacitor, said lower electrode being electrically connected to one of a pair of diffused layers of said metal oxide semiconductor transistor having a conductor type reverse to that of said semiconductor substrate and to said conductive film, said lower electrode extending over said metal oxide semiconductor transistor and said separation region; and forming a dielectric film of said storage capacitor and an upper electrode of said storage capacitor on said lower electrode in a stacked manner.

2. The semiconductor memory device fabricating method according to claim 1, said insulating film is formed all over said resultant surface of said semiconductor substrate by thermally oxidizing an exposed surface of said semiconductor substrate.

3. The semiconductor memory device fabricating method according to claim 1, wherein said conductive film is selectively formed by forming said conductive film all over the resultant surface of said semiconductor substrate and then etching the formed conductive film by anisotropic etching.

4. The semiconductor memory device fabricating method according to claim 1, wherein said conductive film is a polycrystalline silicon film formed by chemical vapor deposition.

* * * * *